United States Patent
Joshi et al.

(10) Patent No.: US 8,349,745 B2
(45) Date of Patent: Jan. 8, 2013

(54) FABRICATION OF A SEMICONDUCTOR NANOPARTICLE EMBEDDED INSULATING FILM LUMINESCENCE DEVICE

(75) Inventors: Pooran Chandra Joshi, Vancouver, WA (US); Hao Zhang, Vancouver, WA (US); Jiandong Huang, Vancouver, WA (US); Apostolos T. Voutsas, Portland, OR (US)

(73) Assignee: Sharp Laboratory of America, Inc., Camas, WA (US)

( * ) Notice: Subject to any disclaimer, the term of this patent is extended or adjusted under 35 U.S.C. 154(b) by 798 days.

(21) Appl. No.: 12/267,698

(22) Filed: Nov. 10, 2008

(65) Prior Publication Data

US 2009/0058266 A1  Mar. 5, 2009

Related U.S. Application Data

(63) Continuation-in-part of application No. 12/249,911, filed on Oct. 11, 2008, which is a continuation-in-part of application No. 12/187,605, filed on Aug. 7, 2008, which is a continuation-in-part of application No. 12/126,430, filed on May 23, 2008, which is a continuation-in-part of application No. 11/418,273, filed on May 4, 2006, now Pat. No. 7,544,625, which is a continuation-in-part of application No. 11/327,612, filed on Jan. 6, 2006, now Pat. No. 7,723,242, and a continuation-in-part of application No. 11/013,605, filed on Dec. 15, 2004, now Pat. No. 7,446,023, and a continuation-in-part of application No. 10/801,377, filed on Mar. 15, 2004, now Pat. No. 7,122,487, and a continuation-in-part of application No. 11/139,726, filed on May 26, 2005, now Pat. No. 7,381,595, and a continuation-in-part of application No. 10/871,939, filed on Jun. 17, 2004, now Pat. No. 7,186,663, and a continuation-in-part of application No. 10/801,374, filed on Mar. 15, 2004, now Pat. No. 7,087,537.

(51) Int. Cl.
*H01L 21/31* (2006.01)
(52) U.S. Cl. .................................................. 438/786
(58) Field of Classification Search .......... 313/500–504; 427/66; 438/786
See application file for complete search history.

(56) References Cited

U.S. PATENT DOCUMENTS 5,783,498 A * 7/1998 Dotta ............................ 438/778
(Continued)

FOREIGN PATENT DOCUMENTS

| JP | 2004-165628 | 6/2004 |
| JP | 2005-268798 | 9/2005 |

OTHER PUBLICATIONS

Ferraioli et al. (Dielectric matrix influence on the photoluminescence properties of silicon nanocrystals, IEEE, 2006).*

(Continued)

*Primary Examiner* — Anh Mai
*Assistant Examiner* — Brenitra M Lee
(74) *Attorney, Agent, or Firm* — Law Office of Gerald Maliszewski; Gerald Maliszewski

(57) ABSTRACT

A method is provided for fabricating a semiconductor nanoparticle embedded Si insulating film for short wavelength luminescence applications. The method provides a bottom electrode, and deposits a semiconductor nanoparticle embedded Si insulating film, including the element of N, O, or C, overlying the bottom electrode. After annealing, a semiconductor nanoparticle embedded Si insulating film has a peak photoluminescence (PL) at a wavelength in the range of 475 to 750 nanometers.

20 Claims, 6 Drawing Sheets

U.S. PATENT DOCUMENTS

| | | | |
|---|---|---|---|
| 6,483,861 B2 | 11/2002 | Moon | |
| 6,710,366 B1 | 3/2004 | Lee et al. | |
| 7,301,274 B2 | 11/2007 | Tanaka et al. | |
| 2004/0106285 A1 | 6/2004 | Zacharias | |
| 2006/0180817 A1* | 8/2006 | Hsu et al. | 257/79 |
| 2006/0189014 A1* | 8/2006 | Li et al. | 438/28 |
| 2006/0211267 A1* | 9/2006 | Joshi et al. | 438/778 |
| 2007/0103068 A1 | 5/2007 | Bawendi et al. | |
| 2007/0181906 A1* | 8/2007 | Chik et al. | 257/103 |
| 2007/0194694 A1 | 8/2007 | Reddy | |
| 2008/0224157 A1* | 9/2008 | Slater | 257/98 |

OTHER PUBLICATIONS

Cho et al. "High efficiency visible electroluminescence from silicon nanocrystals embedded in silicon nitride using a transparent doping layer", Applied Phyics Letters 86, 071909 (2005), pp. 1-3.*

"High efficiency light emission devices in Si", Castagna et al, Mat. Res. Soc. Symp. Proc., vol. 770, p. 12.1.1 (2003).

Ferraioli et al., Dielectric matrix influence on the photoluminescence properties of silicon nanocrystals, IEEE, Sep. 2006, pp. 225-227.

\* cited by examiner

FABRICATION OF A SEMICONDUCTOR NANOPARTICLE EMBEDDED INSULATING FILM LUMINESCENCE DEVICE

RELATED APPLICATIONS

This application is a Continuation-in-part of a pending patent application entitled, HIGH QUANTUM EFFICIENCY SILICON NANOPARTICLE EMBEDDED SiOxNy ELECTROLUMINESCENCE DEVICE, invented by Pooran Joshi et al., Ser. No. 12/249,911, filed Oct. 11, 2008, which is a Continuation-in-Part of:

a pending patent application entitled, FABRICATION OF A SEMICONDUCTOR NANOPARTICLE EMBEDDED INSULATING FILM ELECTROLUMINESCENCE DEVICE, invented by Pooran Joshi et al., Ser. No. 12/187, 605, filed Aug. 7, 2008, which is a Continuation-in-Part of:

a pending patent application entitled, LIGHT EMITTING DEVICE WITH A NANOCRYSTALLINE SILICON EMBEDDED INSULATOR FILM, invented by Huang et al., Ser. No. 12/126,430, filed May 23, 2008, which is a Continuation-in-Part of:

a patent application entitled, SILICON OXIDE THIN-FILMS WITH EMBEDDED NANOCRYSTALLINE SILICON, invented by Pooran Joshi et al., Ser. No. 11/418,273, filed May 4, 2006 now U.S. Pat. No. 7,544,625, which is a Continuation-in-Part of the following applications:
ENHANCED THIN-FILM OXIDATION PROCESS, invented by Pooran Joshi et al., Ser. No. 11/327,612, filed Jan. 6, 2006 now U.S. Pat. No. 7,723,242;
HIGH-DENSITY PLASMA HYDROGENATION, invented by Pooran Joshi et al., Ser. No. 11/013,605, filed Dec. 15, 2004 now U.S. Pat. No. 7,446,023;
DEPOSITION OXIDE WITH IMPROVED OXYGEN BONDING, invented by Pooran Joshi, Ser. No. 10/801, 377, filed Mar. 15, 2004, now U.S. Pat. No. 7,122,487;
HIGH-DENSITY PLASMA OXIDATION FOR ENHANCED GATE OXIDE PERFORMANCE, invented by Joshi et al., Ser. No. 11/139,726, filed May 26, 2005, now U.S. Pat. No. 7,381,595;
HIGH-DENSITY PLASMA PROCESS FOR SILICON THIN-FILMS, invented by Pooran Joshi, Ser. No. 10/871, 939, filed Jun. 17, 2004, now U.S. Pat. No. 7,186,663;
METHOD FOR FABRICATING OXIDE THIN-FILMS, invented by Joshi et al., Ser. No. 10/801,374, filed Mar. 15, 2004, now U.S. Pat. No. 7,087,537.

All the above-referenced applications are incorporated herein by reference.

BACKGROUND OF THE INVENTION

1. Field of the Invention

This invention generally relates to the fabrication of integrated circuit (IC) electroluminescence (EL) and photoluminescence (PL) devices, and more particularly to a luminescence device made from a semiconductor nanoparticle embedded insulating film, with a peak PL wavelength in the range of 475 to 750 nanometers (nm).

2. Description of the Related Art

The fabrication of integrated optical devices involves the deposition of materials with suitable optical characteristics such as absorption, transmission, and spectral response. Thin-film fabrication techniques can produce diverse optical thin films, which are suitable for the production of large area devices at high throughput and yield. Some optical parameters of importance include refractive index (n) and the optical band-gap, which dictate the transmission and reflection characteristics of the thin film.

Typically, bilayer or multilayer stack thin-films are required for the fabrication of optical devices with the desired optical effect. Various combinations of the metal, dielectric, and/or semiconductor layers are also used to form multilayer films with the desired optical characteristics. The selection of the material depends on the target reflection, transmission, and absorption characteristics. While a single layer device would obviously be more desirable, no single thin-film material has been able to provide the wide range of optical dispersion characteristics required to get the desired optical absorption, band-gap, refractive index, reflection, or transmission over a wide optical range extending from ultraviolet (UV) to far infrared (IR) frequencies.

Silicon is the material of choice for the fabrication of optoelectronic devices because of well-developed processing technology. However, the indirect band-gap makes it an inefficient material for optoelectronic devices. Over the years, various R&D efforts have focused on tailoring the optical function of Si to realize Si-based optoelectronics. The achievement of efficient room temperature light emission from the crystalline silicon is a major step towards the achievement of fully Si-based optoelectronics.

At present, the Si thin film-based photodetectors operating at wavelengths shorter than 850 nm are attractive for low cost, highly integrated CMOS devices. Si is an indirect bandgap semiconductor with limited speed-responsivity performance, but it is still useful for detection in UV-VIS (visible)-NIR (near-IR) spectrum. However, the indirect bandgap of Si limits the critical wavelength of Si to 1.12 µm, beyond which its absorption goes to zero, making it insensitive to two primary telecommunication wavelengths of 1.30 and 1.55 µm. An additional issue with Si based photo-detectors is the dark current limiting the signal-to-noise ratio (SNR), and the thermal instability at operating temperatures higher than 50° C.

The fabrication of stable and reliable optoelectronic devices requires Si nanocrystals with high photoluminescence (PL) and electroluminescence (EL) quantum efficiency. EL is both an optical phenomenon and an electrical phenomenon in which a material emits light in response to an electric current passed through it, or in response to a strong electric field. PL is a process in which a substance absorbs photons (electromagnetic radiation) and then re-radiates photons. Quantum mechanically, PL can be described as an excitation to a higher energy state and then a return to a lower energy state accompanied by the emission of a photon. The period between absorption and emission is typically extremely short, in the order of 10 nanoseconds.

One approach that is being actively pursued for integrated optoelectronic devices is the fabrication of $SiO_x$ ($x \leq 2$) thin films with embedded Si nanocrystals. The luminescence due to recombination of the electron-hole pairs confined in Si nanocrystals depends strongly on the nanocrystal size. The electrical and optical properties of the nanocrystalline Si embedded $SiO_xN_y$ thin films depend on the size, concentration, and distribution of the Si nanocrystals. Various thin-film deposition techniques such as sputtering and plasma-enhanced chemical vapor deposition (PECVD), employing a capacitively-coupled plasma source, are being investigated for the fabrication of stable and reliable nanocrystalline Si thin films, which are also referred to herein as nanocrystalline Si embedded insulating thin films.

However, conventional PECVD and sputtering techniques have the limitations of low plasma density, inefficient power coupling to the plasma, low ion/neutral ratio, and uncontrolled bulk, and interface damage due to high ion bombardment energy. Therefore, the oxide films formed from a conventional capacitively-coupled plasma (CCP) generated plasma may create reliability issues due to the high bombardment energy of the impinging ionic species. It is important to control or minimize any plasma-induced bulk or interface damage. However, it is not possible to efficiently control the ion energy using the radio frequency (RF) power of CCP generated plasma. Any attempt to enhance the reaction kinetics by increasing the applied power results in increased bombardment of the deposited film, creating a poor quality films with a high defect concentration. Additionally, the low plasma density associated with these types of sources ($\sim 1\times 10^8$-$10^9$ cm$^{-3}$) leads to limited reaction possibilities in the plasma and on the film surface, inefficient generation of active radicals and ions for enhanced process kinetics, inefficient oxidation, and process and system induced impurities, which limits their usefulness in the fabrication of low-temperature electronic devices.

The pulsed laser deposition and ion implantation of Si in dielectric thin films has also been extensively investigated for the creation of Si nano-particles. However, the ion implantation approach is not suitable for the uniform distribution of the nc-Si particles across the film thickness. Additionally, the creation and control of the nc-Si particles exhibiting high PL/EL response at shorter wavelengths (475-700 nm) is still a challenge due to limitations with the above-mentioned approaches. Conventional PECVD and sputtering techniques have the limitations of low plasma density, inefficient power coupling to the plasma, low ion/neutral ratio, and uncontrolled bulk and interface damage due to high ion bombardment energy. The ion implantation approach is not suitable for the uniform distribution of the nc-Si particles across the film thickness. Further, the particle agglomeration in Si ion implanted and pulsed laser deposited dielectric films typically leads to red shift of the PL/EL spectrum.

A deposition process that offers a more extended processing range and enhanced plasma characteristics than conventional plasma-based techniques, such as sputtering or PECVD, is required to generate and control the particle size for PL and electroluminescent (EL) based device development.

For the fabrication of high quality SiOx thin films, the oxidation of a grown film is also critical to ensure high quality insulating layer across the nanocrystalline Si particles. A process that can generate active oxygen radicals at high concentrations will ensure the effective passivation of the Si nanoparticles (nc-Si) in the surrounding oxide matrix. A plasma process that can minimize plasma-induced damage will enable the formation of a high quality interface that is critical for the fabrication of high quality devices. Low thermal budget efficient oxidation and hydrogenation processes are critical and will be significant for the processing of high quality optoelectronic devices. The higher temperature thermal processes can interfere with the other device layers and they are not suitable in terms of efficiency and thermal budget, due to the lower reactivity of the thermally activated species. Additionally, a plasma process which can provide a more complete solution and capability in terms of growth/deposition of novel film structures, oxidation, hydrogenation, particle size creation and control, and independent control of plasma density and ion energy, and large area processing is desired for the development of high performance optoelectronic devices. Also, it is important to correlate the plasma process with the thin film properties as the various plasma parameters dictate the thin film properties and the desired film quality depends on the target application. Some of the key plasma and thin-film characteristics that depend on the target application are deposition rate, substrate temperature, thermal budget, density, microstructure, interface quality, impurities, plasma-induced damage, state of the plasma generated active species (radicals/ions), plasma potential, process and system scaling, and electrical quality and reliability. A correlation among these parameters is critical to evaluate the film quality as the process map will dictate the film quality for the target application. It may not be possible to learn or develop thin-films by just extending the processes developed in low density plasma or other high-density plasma systems, as the plasma energy, composition (radical to ions), plasma potential, electron temperature, and thermal conditions correlate differently depending on the process map.

Si nanocrystals with sizes in the range of 1-10 nm have shown enhanced optical and electrical properties due to quantum confinement effects. One challenge in the development of high performance nc-Si embedded thin film based EL devices is the creation and control of the nc-Si particles sizes and distribution, the properties of the inter-particle medium, and the nc-Si particle/dielectric interface quality. EL device efficiency strongly depends on the intrinsic light generation efficiency of the thin film medium, light extraction efficiency, electrical conductivity, and the breakdown field strength of the film. Low temperatures are generally desirable in liquid crystal display (LCD) manufacture, where large-scale devices are formed on transparent glass, quartz, or plastic substrate. These transparent substrates can be damaged when exposed to temperatures exceeding 650 degrees C. To address this temperature issue, low-temperature Si oxidation processes have been developed. These processes use a high-density plasma source such as an inductively coupled plasma (ICP) source, and are able to form Si oxide with a quality comparable to 1200 degree C. thermal oxidation methods.

The HDP process described herein overcomes the limitations/issues of the deposition rate, film density, nc-Si particle density and size control, bulk and interfacial defect control, defect passivation, and inter-particle medium quality control, when contrasted to the Si ion implantation approach and various physical and chemical techniques currently being investigated for the fabrication of nc-Si embedded dielectric thin films.

It would be advantageous if the benefits realized with high-density plasma deposition could be used in the fabrication of short wavelength (475 to 750 nm) luminescence devices made from semiconductor nanoparticle embedded Si insulating films. As used herein, a Si insulating film is an insulating film with Si as one of the constituent elements.

SUMMARY OF THE INVENTION

Described herein is a high-density plasma (HDP) based process for the fabrication of nc-Si embedded Si insulating thin films with controlled microstructural, optical, and electrical properties. The HDP technique is characterized by high plasma concentration, low plasma potential, and independent control of plasma energy and density; which provides unique process possibilities and control. The high plasma density and low plasma potential of the high density plasma process are attractive for the creation of the Si nanocrystals while minimizing the plasma induced bulk and interface damage. The HDP process has been exploited to create of Si nanocrystals in a SiO$_x$ matrix, for example, with photoluminescence (PL) emission in the wavelength range of 475-700 nm. The HDP deposited SiO$_x$ films have shown PL signal even in the as-deposited state, while subsequent annealing results in significant enhancement of the PL intensity due to phase separation and quantum confinement effects. The HDP process permits control over the nanocrystal size, concentration, and distribution in the as-deposited films so that the emission and electrical characteristics of the films after annealing can be exploited for the fabrication of efficient PL/EL and memory devices. The high-density plasma process is suitable for the fabrication of single layer, bilayer, or multilayer structures suitable for optoelectrical applications by sequential processing, using either in-situ or cluster tooling.

Accordingly, a method is provided for fabricating a semiconductor nanoparticle embedded Si insulating film for short wavelength electroluminescence (EL) or PL applications. The method provides a bottom electrode. Hydrogen gas is added using a high-density (HD) plasma-enhanced chemical vapor deposition (HDPECVD) process, and a semiconductor nanoparticle embedded Si insulating film is deposited overlying the bottom electrode. The semiconductor nanoparticle embedded Si insulating film includes the element of N, O, or C. After annealing, a semiconductor nanoparticle embedded Si insulating film is formed having peak PL emissions in the wavelengths between 475 and 750 nanometers (nm).

In one aspect, the semiconductor nanoparticle embedded Si insulating film is deposited by introducing a semiconductor precursor with the hydrogen, and using the HDPECVD process to supply power to a top electrode at a frequency in the range of 13.56 to 300 megahertz (MHz), and a power density of up to 10 watts per square centimeter (W/cm$^2$).

Additional details of the above-described method and an EL device with a semiconductor nanoparticle embedded Si insulating film are presented below.

DETAILED DESCRIPTION

Figure 1:
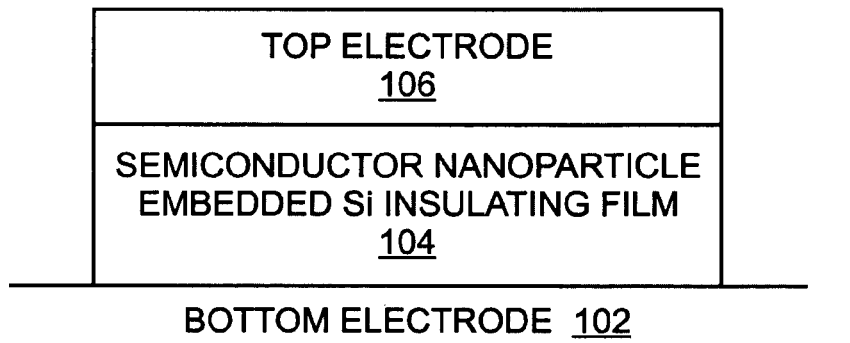
FIG. 1 is a partial cross-sectional view of a short wavelength luminescence device with a semiconductor nanoparticle embedded Si insulating film.

FIG. 1 is a partial cross-sectional view of a short wavelength luminescence device with a semiconductor nanoparticle embedded Si insulating film. The luminescence device 100 comprises a bottom electrode 102. The bottom electrode 102 may be a doped semiconductor, metal, or polymer. A semiconductor nanoparticle embedded Si insulating film 104 overlies the bottom electrode 102. The semiconductor nanoparticle embedded Si insulating film 104 includes the element of N, O, or C, and has a peak photoluminescence (PL) intensity at a wavelength in the range of about 475 nanometers (nm) to 750 nm. For example, the semiconductor nanoparticle embedded Si insulating film may be a non-stoichiometric $SiO_XN_Y$ thin-film, where (X+Y<2 and Y>0), $SiC_X$, where X<1, or SiOx, where X<2. The semiconductor nanoparticles can be either Si or Ge.

The semiconductor nanoparticles embedded in the Si insulating film 104 have a diameter in the range of about 1 to 10 nanometers (nm), and are made from either Si or Ge. In some aspects, a nanoparticle range of 1 to 5 nm is preferred. A top electrode 106 overlies the semiconductor nanoparticle embedded Si insulating film 104. The top electrode may be a thin metal or transparent metal oxide such as indium tin oxide (ITO), for example.

It has been possible to fabricate high performance nc-Si embedded dielectric films by analyzing the key high density plasma process parameters impacting the optical dispersion, nc-Si growth, and size as evidenced in the PL response of the films. The n-k dispersion can be controlled by varying the N/O ratio, as well as the Si richness in the films. The PL response characteristics can be addressed by controlling the nc-Si size, which strongly depends on the system pressure and RF power. However, the correlation among these thin film properties and high density plasma deposition conditions needed to fabricate high performance EL devices operating at low voltages has been, before now, impossible to determine due to the large number of variables.

In another aspect, the semiconductor nanoparticle embedded Si insulating film 104 includes a Type 3, Type 4, Type 5, or rare earth elements dopant, and the EL device 100 has optical absorption characteristics in the range of frequencies from deep ultraviolet (UV) to far infrared (IR).

Figure 2:
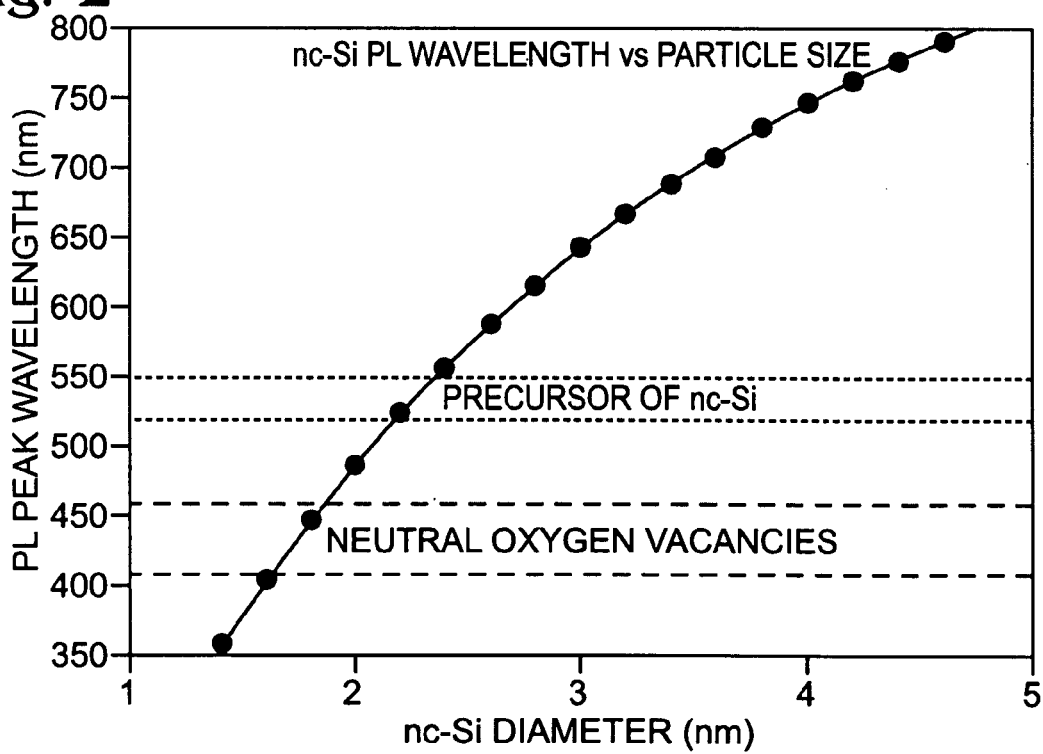
FIG. 2 is a graph depicting the relationship between photoluminescence (PL) wavelength and silicon nanoparticle size.

FIG. 2 is a graph depicting the relationship between photoluminescence (PL) wavelength and silicon nanoparticle size. The development of nc-Si embedded Si thin films with PL emissions covering the visible part of the spectrum in the range of 475 to 750 nm is attractive for diverse optoelectronic applications. The high-density plasma (HDP) process described below is effective in the creation and control of the nc-Si particles in the range of 1-5 nm.

Figure 3:
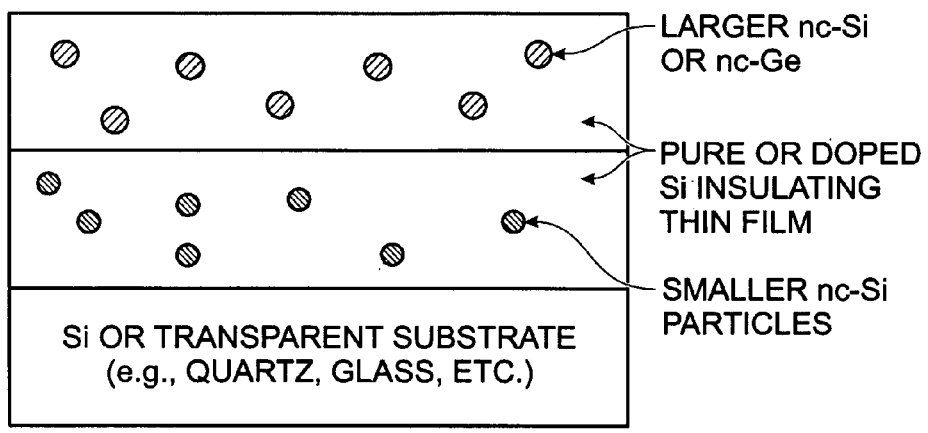
FIG. 3 is a partial cross-sectional view of an EL device with a multilayer silicon nanoparticle embedded $SiO_xN_y$ film.

FIG. 3 is a partial cross-sectional view of an EL device with a multilayer silicon nanoparticle embedded Si insulating film. The hole and electron injecting layers can be a single or multilayer structures to enhance the carrier injection into the nc-Si embedded dielectric film. The spectral response and the electrical conductivity of the nc-Si thin film can be further modified by in-situ or ex-situ doping by any suitable method.

Figure 4:
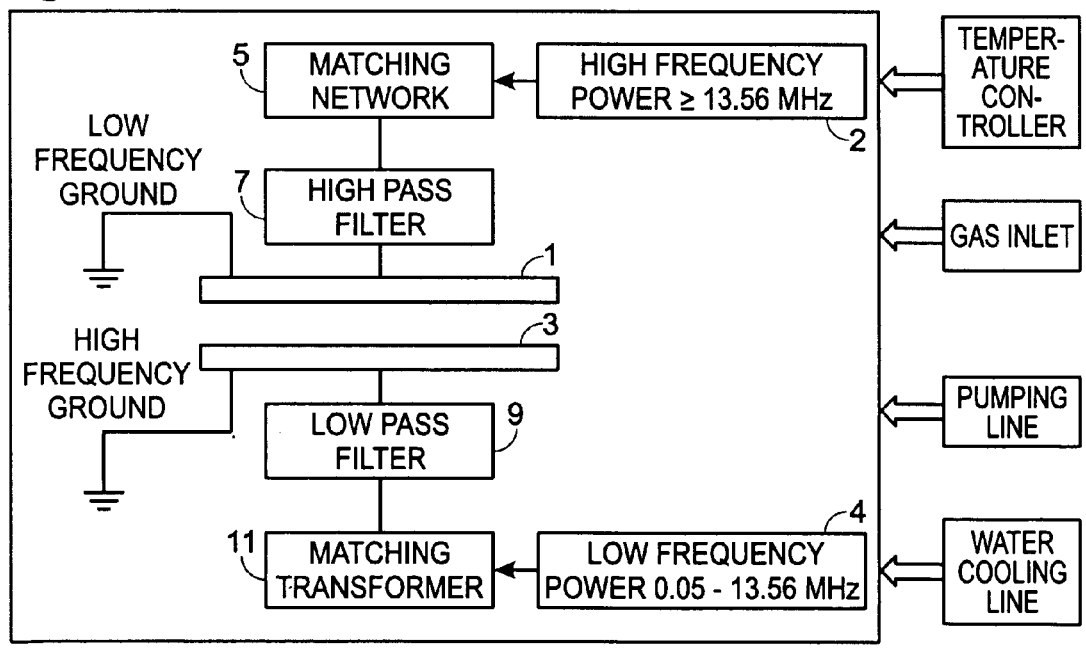
FIG. 4 is a schematic drawing of a high-density plasma (HDP) system with an inductively coupled plasma source.

FIG. 4 is a schematic drawing of a high-density plasma (HDP) system with an inductively coupled plasma source. The top electrode 1 is driven by a high frequency radio frequency (RF) source 2, while the bottom electrode 3 is driven by a lower frequency power source 4. The RF power is coupled to the top electrode 1, from the high-density inductively coupled plasma (ICP) source 2, through a matching network 5 and high pass filter 7. The power to the bottom electrode 3, through a low pass filter 9 and matching transformer 11, can be varied independently of the top electrode 1. The top electrode power frequency can be in the range of about 13.56 to about 300 megahertz (MHz) depending on the ICP design. The bottom electrode power frequency can be varied in the range of about 50 kilohertz (KHz) to about 13.56 MHz, to control the ion energy. The pressure can be varied up to 500 mTorr. The top electrode power can be as great as about 10 watts per square-centimeter (W/cm$^2$), although the above-described semiconductor nanocrystal embedded Si insulating films can be formed using a top electrode power of less than 5 W/cm$^2$. The bottom electrode power can be as great as about 3 W/cm$^2$. It should be noted that an HDP system may also be enabled using microwave frequencies in the gigahertz range.

One interesting feature of the HDP system is that there are no inductive coils exposed to the plasma, which eliminates any source-induced impurities. The power to the top and bottom electrodes can be controlled independently. There is no need to adjust the system body potential using a variable capacitor, as the electrodes are not exposed to the plasma. That is, there is no crosstalk between the top and bottom electrode powers, and the plasma potential is low, typically less than 20 V. System body potential is a floating type of potential, dependent on the system design and the nature of the power coupling.

The HDP tool is a true high-density plasma process with an electron concentration of greater than $1 \times 10^{11}$ cm$^{-3}$, and the electron temperature is less than 10 eV. There is no need to maintain a bias differential between the capacitor connected to the top electrode and the system body, as in many high-density plasma systems and conventional designs such as capacitively-coupled plasma tools. Alternately stated, both the top and bottom electrodes receive RF and low frequency (LF) powers.

The creation and control of the nc-Si particle size, density, and distribution is a factor in the fabrication of high performance optoelectronic devices. H$_2$ gas in the plasma is very effective in controlling the nc-Si size and optical dispersion characteristics. The combination of the various processes described herein is effective in the creation of nc-Si particles exhibiting PL response in the wavelength range of 475-750 nm. Semiconductor nanoparticle embedded Si insulating thin film properties are controlled by varying the gas flow rate and ratios, RF power, system pressure, and substrate temperature. The deposition process is optimized in terms of the optical, PL, and EL emission characteristics of the semiconductor nanoparticle embedded Si insulating film thin films. The various gas combinations and the flow ratios, which are effective in the fabrication of high quality nc-Si embedded SiO$_x$N$_y$ thin films, are described in Table 1.

TABLE 1

High density plasma processing of SiOx thin films

| | |
|---|---|
| Top Electrode Power | 13.56-300 MHz, up to 10 W/cm$^2$, |
| Bottom Electrode Power | 50 KHz-13.56 MHz, up to 3 W/cm$^2$ |
| Pressure | 1-500 mTorr |
| Gases: general | Any suitable precursor for Si + Source of Oxygen (e.g. O$_2$ or N$_2$O) + H$_2$ |
| Gases: Exemplary Process | SiH$_4$ + N$_2$O + H$_2$ |
| H$_2$/SiH$_4$ ratio | 0-1.50 |
| SiH$_4$/N$_2$O | 0.1-5.0 |
| Temperature | 25-400° C. |
| Film Thickness (nm) | 5 nm-1 μm |

Figure 5A:
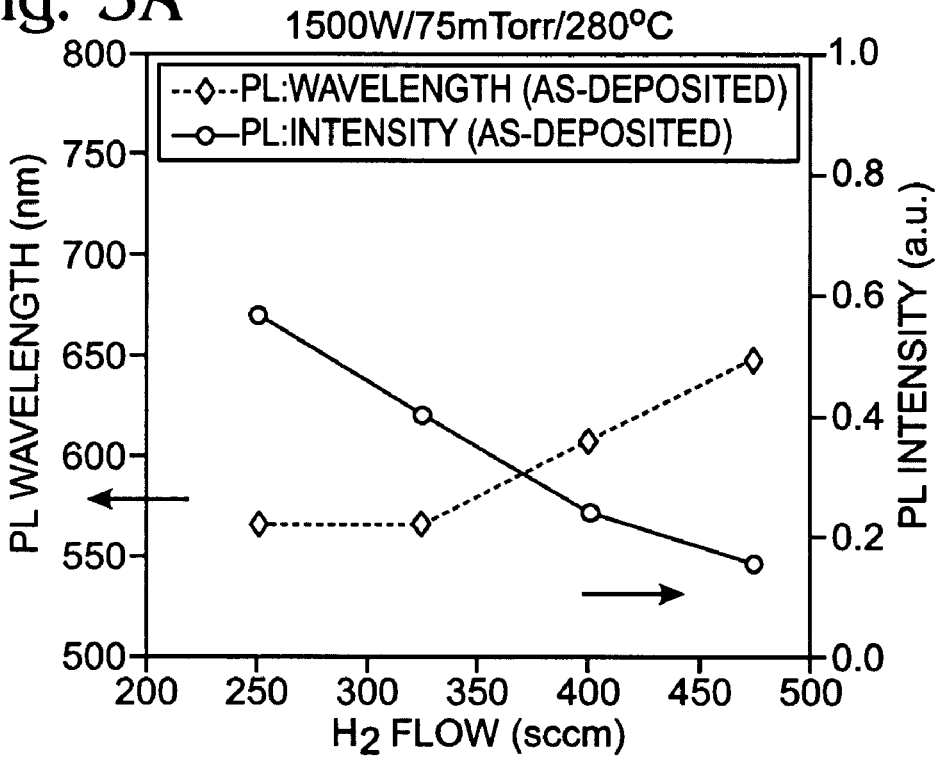
FIGS. 5A and 5B depict the PL response of as-deposited and annealed samples as a function of the $H_2$ flow.
Figure 5B:
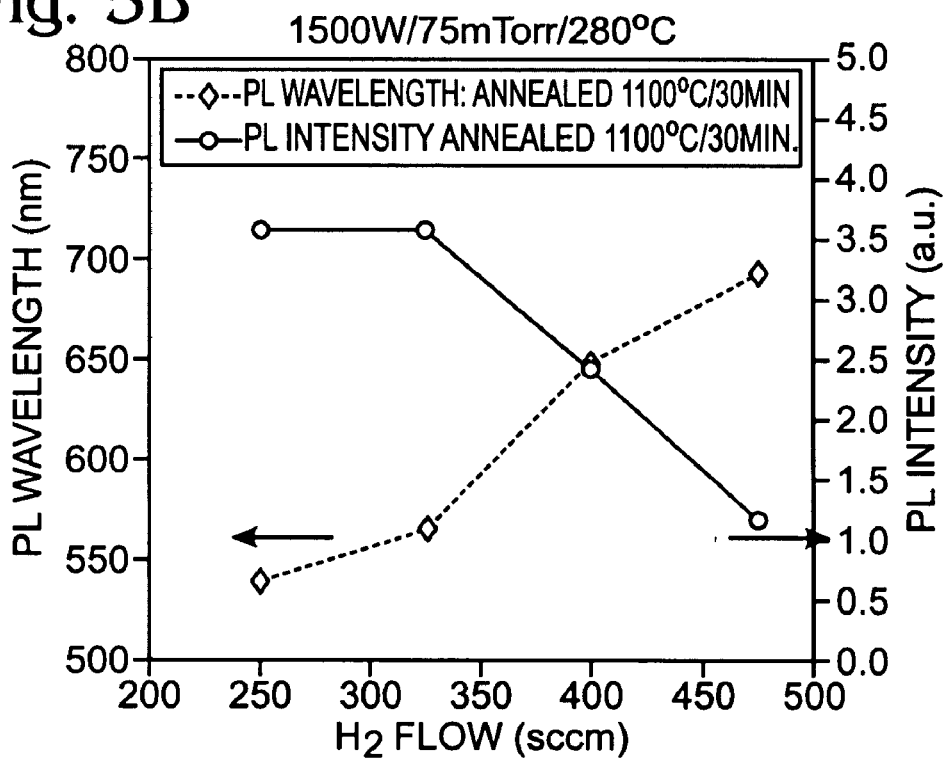

FIGS. 5A and 5B depict the PL response of as-deposited and annealed samples as a function of the H$_2$ flow. The SiH$_4$/N$_2$O flow was kept constant at 5/5 sccm. The films were deposited at 280° C. The PL wavelength of the films was found to increase from 565 to 649 nm with an increase in the hydrogen flow from 250 to 475 sccm. The PL emission wavelength was found to increase after post-deposition annealing at 1100° C. for 30 min. However, the shifts were lower than 50 nm, as shown in FIG. 5B.

Figure 6A:
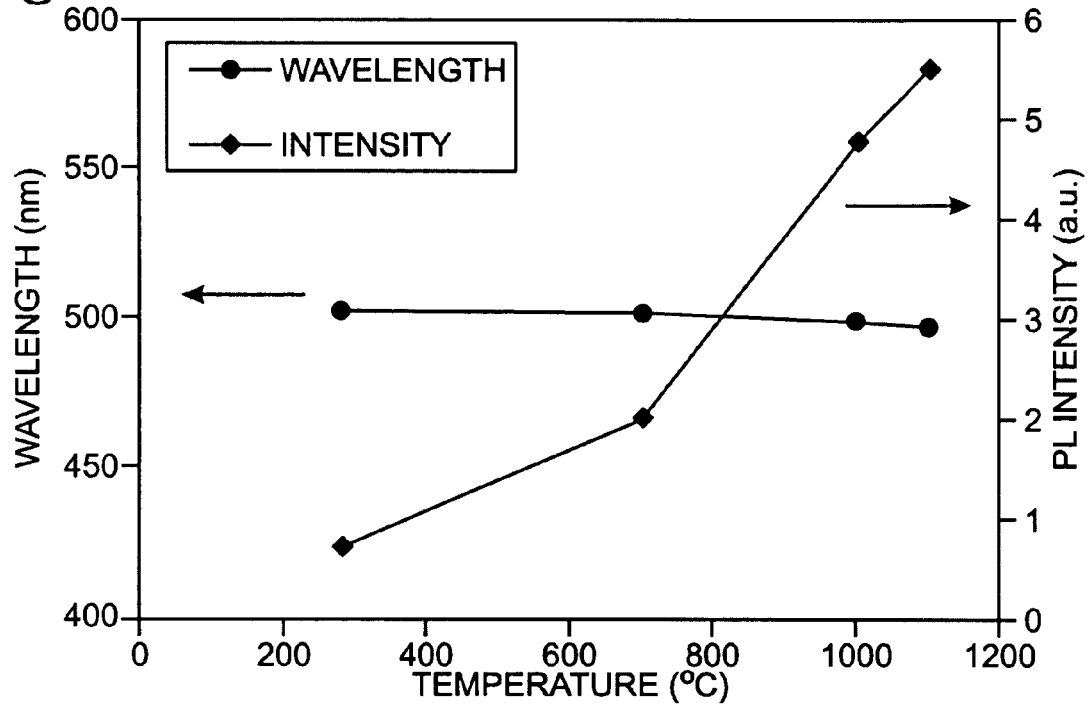
FIGS. 6A and 6B depict the effect of the annealing temperature on the PL response (FIG. 6A) and the PL spectra of the films as a function of the rapid thermal annealing temperature (FIG. 6B).
Figure 6B:
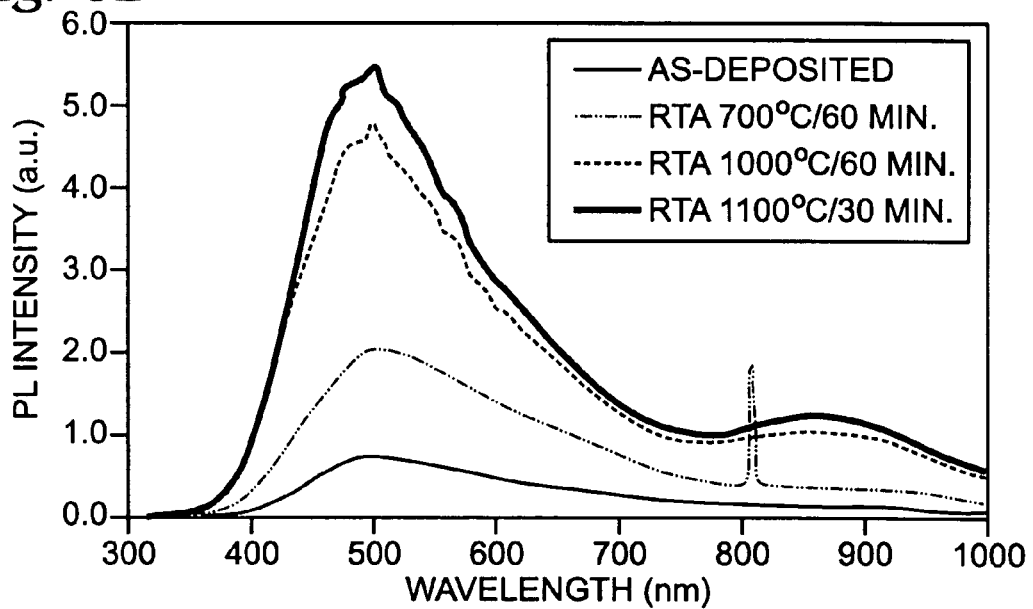

FIGS. 6A and 6B depict the effect of the annealing temperature on the PL response (FIG. 6A) and the PL spectra of the films as a function of the rapid thermal annealing temperature (FIG. 6B). The films were deposited at a SiH$_4$/N$_2$O/H$_2$ ratio of 15/15/150 sccm. The applied RF power, system pressure, and substrate temperature were 700 W, 75 mTorr, and 280° C., respectively. As shown in FIG. 6A, the PL emission wavelength is maintained at around 500 nm for the as-deposited and annealed films. FIG. 6B shows a well defined PL peak at 500 nm.

The HD-PECVD process is effective in controlling the optical characteristics of the Si insulator thin films over a wide range by varying the processing conditions. Table 2 shows the effect of H$_2$ flow on the refractive index of the SiO$_x$N$_y$ thin films deposited at an RF power of 1500 W and system pressure of 75 mTorr. The refractive index increases with an increase in the hydrogen flow, leading to an increased nc-Si particle size, which indicates an increase in the Si richness of the films.

TABLE 2

Effect of H$_2$ flow on the refractive index of SiOxNy thin films

| SiH$_4$ (sccm) | N$_2$O (sccm) | H$_2$ (sccm) | n @ 632 nm |
|---|---|---|---|
| 5 | 5 | 250 | 1.774 |
| 5 | 5 | 325 | 1.793 |
| 5 | 5 | 400 | 1.817 |
| 5 | 5 | 475 | 1.852 |

The interfacial and the hulk quality of the SiO$_2$ and the nc-Si embedded Si insulating thin films are important for the fabrication of stable and reliable electronic devices. The HDP characteristics are suitable for the fabrication of novel thin films with high structural density, low process induced impurity content, and minimal bulk or interface damage. In general, the bulk and interface defect concentration of Si insulating thin films can be further reduced by hydrogen passivation of the defect sites for the fabrication of advanced optoelectronic devices with high quantum efficiency. The films can be hydrogenated by thermal and plasma methods. The films can be hydrogenated by thermal annealing in a N$_2$/H$_2$ atmosphere at any suitable temperature. The thermal hydrogenation process typically requires high thermal budget due to low diffusion coefficients of molecular hydrogen species at thermal energies.

A high-density plasma hydrogenation process is attractive for an efficient low temperature and low thermal budget passivation of defects and dangling bonds in the deposited Si, SiO$_x$N$_y$, SiCx, and SiO$_X$ thin films. Table 3 summarizes the high-density plasma processing conditions suitable for the efficient hydrogenation of thin films.

TABLE 3

High density plasma hydrogenation process range

| | |
|---|---|
| Top Electrode Power | 13.56-300 MHz, up to 10 W/cm$^2$, |
| Bottom Electrode Power | 50 KHz-13.56 MHz, up to 3 W/cm$^2$ |
| Pressure | 1-500 mTorr |
| Gases: General | H$_2$ + Any suitable Inert Gas |
| Gases: Specific Process | H$_2$ |
| Temperature | 25-300° C. |
| Time | 30 s-60 min |

The presence of an appreciable PL/EL signal in the as-deposited thin film shows the potential of the HDP process in creating Si nanocrystals, even at temperatures lower than 300° C. The PL/EL emission characteristics of the semiconductor nanoparticle embedded Si insulating thin films can be further enhanced by thermal treatment in a suitable ambient. The high-temperature annealing results in a separation of the Si insulating film phase into Si clusters or nanocrystals separated by a dielectric matrix. The annealing temperature/time can be correlated with other thin-film deposition process conditions and properties so that the Si cluster size, concentration, and distribution can be varied. Exemplary annealing conditions are listed in Table 4.

TABLE 4

Post-deposition thermal annealing range
for nc-Si embedded SiOxNy thin films.

| | |
|---|---|
| Temperature Range | 300-1100° C. |
| Time | 10-60 min |
| Ambient | Inert gas/H$_2$ |

As used herein, a nc-Si embedded $SiO_xN_y$ (x+y<2) thin film is also referred to as a non-stoichiometric $SiO_xN_y$ thin-film, where (X+Y<2 and Y>0). A non-stoichiometric $SiO_xN_y$ thin-film, as used herein, is understood to be a film with Si nanoparticles (nc-Si), and may also be referred to as a Si-rich $SiO_xN_y$ thin-film. The term "non-stoichiometric" as used herein retains the meaning conventionally understood in the art as a chemical compound with an elemental composition that cannot be represented by a ratio of well-defined natural numbers and is, therefore, in violation of the law of definite proportions. Conventionally, a non-stoichiometric compound is a solid that is understood to include random defects, resulting in the deficiency of one element. Since the compound needs to be overall electrically neutral, the missing atom's charge requires compensation in the charge for another atom in the compound, by either changing the oxidation state, or by replacing it with an atom of a different element with a different charge. More particularly, the "defect" in a non-stoichiometric $SiO_xN_y$ involves nanocrystalline particles.

Figure 7A:
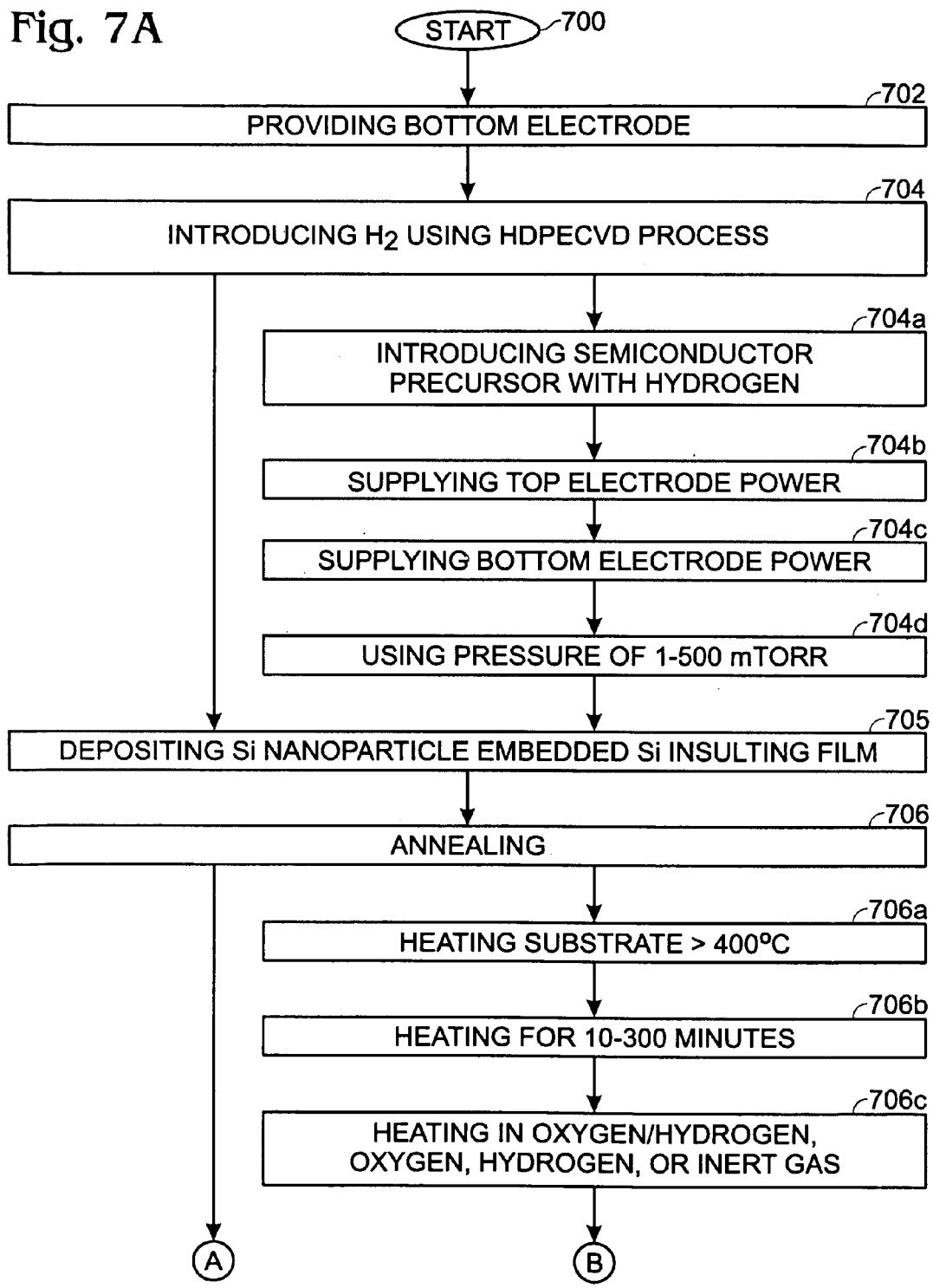
FIGS. 7A and 7B are a flowchart illustrating a method for fabricating a semiconductor nanoparticle embedded Si insulating film for short wavelength luminescence (EL and PL) applications.
Figure 7B:
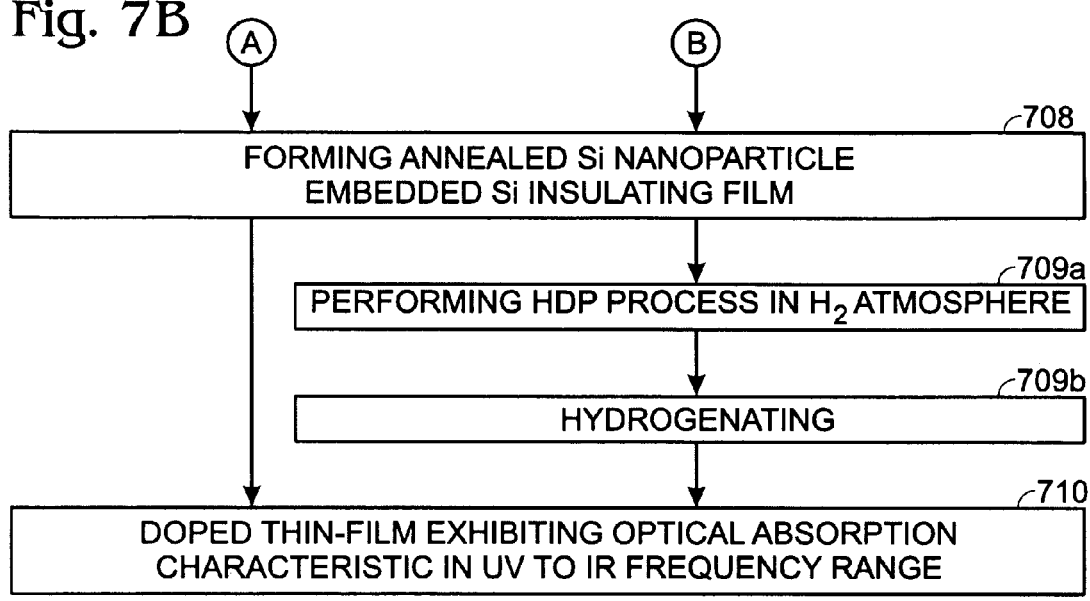

FIGS. 7A and 7B are a flowchart illustrating a method for fabricating a semiconductor nanoparticle embedded Si insulating film for short wavelength luminescence (EL and PL) applications. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 700.

Step 702 provides a bottom electrode. Step 704 introduces a hydrogen gas using an HDPEVCD process. Step 705 deposits a semiconductor nanoparticle embedded Si insulating film including the element of N, O, or C, overlying the bottom electrode. For example, the semiconductor nanoparticle embedded Si insulating film may be non-stoichiometric $SiO_xN_y$ thin-film, where (X+Y<2 and Y>0). The optical dispersion characteristics of the non-stoichiometric $SiO_xN_y$ thin-film films can also be tailored by varying the values of X and Y with respect to the thickness of the thin-film. Alternately, the semiconductor nanoparticle embedded Si insulating film may be $SiC_X$, where X<1, or SiOx, where X<2. The semiconductor nanoparticles are either Si or Ge. In one aspect, the semiconductor thin-film is deposited by heating an underlying substrate to a temperature of less than about 400° C. Note: in some aspects the bottom electrode and substrate are the same element.

In another aspect depositing the semiconductor nanoparticle embedded Si insulating film in Step 705 including depositing a semiconductor nanoparticle embedded Si insulating films with a Si nanoparticle distribution that varies with respect to the film thickness. For example, the nanoparticle distribution may follow a graduated or stepped function. In another aspect, the distribution is in a multilayered pattern.

Step 706 anneals the semiconductor nanoparticle embedded Si insulating film. Step 708 forms an annealed semiconductor nanoparticle embedded Si insulating film having a peak PL intensity in the wavelengths between about 475 and 750 nm.

In one aspect, depositing using the HDPECVD process in Step 704 includes substeps. Step 704a introduces a semiconductor precursor with hydrogen. Step 704b supplies power to a top electrode at a frequency in the range of 13.56 to 300 megahertz (MHz), and a power density of up to 10 watts per square centimeter (W/cm$^2$). Step 704c supplies power to a bottom electrode at a frequency in the range of 50 kilohertz to 13.56 MHz, and a power density of up to 3 W/cm$^2$. In one aspect, Step 704a uses an atmosphere pressure in the range of 1 to 500 mTorr, and supplies an oxygen source gas. For example, N$_2$O, NO, O$_2$, or O$_3$ may be used. In another aspect, Step 704a supplies an inert noble gas in addition to the oxygen source gas. In a different aspect, Step 704a introduces the semiconductor precursor and hydrogen with a nitrogen source gas, such as N$_2$ or NH$_3$.

In one aspect, the HDPECVD process uses an inductively coupled plasma (ICP) source. In another aspect, the HDPECVD process uses a plasma concentration of greater than $1\times10^{11}$ cm$^{-3}$, with an electron temperature of less than 10 eV. It should be noted that the semiconductor nanoparticle embedded Si insulating films may be fabricated by any suitable high density plasma technique operating at RF or microwave frequencies. For example, in other aspects the HDP source may operate in the microwave range (1 GHz-10 GHz).

In another aspect, supplying the semiconductor precursor and hydrogen in Step 704a includes supplying a precursor such as $Si_nH_{2n+2}$ or $Ge_nH_{2n+2}$, where n varies from 1 to 4, $SiH_xR_{4-x}$ where R is Cl, Br, or I, and where x varies from 0 to 3, or $GeH_xR_{4-x}$ where R is Cl, Br, or I, and x varies from 0 to 3. In this manner, $SiO_xN_y$ thin-film is formed. Alternately, if a $SiC_X$ thin-film is to be formed, the C source may be any suitable hydrocarbon-containing precursor. Some examples of hydrocarbon-containing precursors include alkanes ($C_nH_{2n+2}$), alkenes ($C_nH_{2n}$), alkynes ($C_nH_{2n-2}$), Benzene ($C_6H_6$), and Toluene ($C_7H_8$).

The annealed semiconductor nanoparticle embedded Si insulating film formed in Step 708 may be an intrinsic or doped semiconductor nanoparticle embedded Si insulating films. If doped, the dopant may be a Type 3, Type 4, Type 5, or rare earth element dopant. Then, in Step 710, the annealed semiconductor nanoparticle embedded Si insulating film exhibits optical absorption characteristics in the range of frequencies from deep ultraviolet (UV) to far infrared (IR).

In another aspect, annealing the semiconductor nanoparticle embedded Si insulating film in Step 706 includes using either a flash or laser annealing, with a heat source having a radiation wavelength of either about 150 to 600 nm or about 9 to 11 micrometers. In a different aspect, annealing the semiconductor nanoparticle embedded Si insulating film includes substeps. Step 706a heats the substrate to a temperature of greater than about 400° C. Step 706b heats for a time duration in the range of about 10 to 300 minutes. Step 706c heats in an atmosphere of oxygen and hydrogen, oxygen, hydrogen, or inert gases. Then, forming the annealed semiconductor nanoparticle embedded Si insulating film in Step 708 includes modifying the size of the semiconductor nanoparticles in the Si insulating film in response to the annealing.

In another aspect, if Step 702 provides a bottom electrode on a temperature-sensitive substrate such as glass, a metalized substrate, or plastic, then Step 706 may anneal the semiconductor nanoparticle embedded Si insulating film at a temperature of less than 650° C.

In a different aspect, Step 709a performs a HD plasma treatment on the annealed semiconductor nanoparticle embedded Si insulating film in an $H_2$ atmosphere, using a substrate temperature of less than 400° C. Step 709b hydrogenates the annealed semiconductor nanoparticle embedded Si insulating film. For example, the hydrogenation may be accomplished using an HD plasma process as follows:

supplying power to a top electrode at a frequency in the range of 13.56 to 300 MHz, and a power density of up to 10 $W/cm^2$;

supplying power to a bottom electrode at a frequency in the range of 50 kilohertz to 13.56 MHz, and a power density of up to 3 $W/cm^2$;

using an atmosphere pressure in the range of 1 to 500 mTorr; and, supplying an atmosphere or either $H_2$ and an inert gas, or $H_2$.

Short wavelength luminescence devices have been described that are made with semiconductor nanoparticles embedded Si insulating films. Specific examples of $SiO_XN_Y$ thin-films, SiOx, and $SiC_X$ thin-film fabrication details have been presented. Some details of other specific materials and process details have also been used to illustrate the invention. However, the invention is not limited to merely these examples. Other variations and embodiments of the invention will occur to those skilled in the art.

We claim:

1. A method for fabricating a semiconductor nanoparticle embedded Si insulating film for short wavelength luminescence (electroluminescence—EL and photoluminescence—PL) applications, the method comprising:
    providing a bottom electrode;
    introducing a hydrogen gas into a high density (HD) plasma-enhanced chemical vapor deposition (PECVD) process as follows:
        introducing a semiconductor precursor with the hydrogen; and,
        supplying power to a top electrode at a frequency in the range of 13.56 megahertz (MHz) to 10 gigahertz, and a power density of up to 10 watts per square centimeter ($W/cm^2$);
    depositing a semiconductor nanoparticle embedded Si insulating film including an element selected from a group consisting of O, N, and C, overlying the bottom electrode;
    annealing the semiconductor nanoparticle embedded Si insulating film; and,
    forming an annealed semiconductor nanoparticle embedded Si insulating film having a peak photoluminescence (PL) intensity at a wavelength in a range of about 475 nanometers (nm) to 750 nm.

2. The method of claim 1 wherein depositing the semiconductor nanoparticle embedded Si insulating film overlying the bottom electrode includes depositing SiOxNy, where (X+Y<2 and Y>0); and,
    wherein forming the annealed semiconductor nanoparticle embedded Si insulating film includes forming an annealed SiOxNy film with a refractive index of in a range of 1.6-1,9, as measured at 632 nm.

3. The method of claim 1 wherein using the HDPECVD process includes supplying power to a bottom electrode at a frequency in the range of 50 kilohertz to 13.56 MHz, and a power density of up to 3 $W/cm^2$;
    wherein introducing the semiconductor precursor and hydrogen includes:
        using an atmosphere pressure in the range of 1 to 500 mTorr; and,
        supplying an oxygen source gas.

4. The method of claim 3 wherein supplying the oxygen source gas includes supplying an oxygen source gas selected from a group consisting of $N_2O$, NO, $O_2$, and $O_3$.

5. The method of claim 3 wherein introducing the semiconductor precursor and hydrogen includes supplying an inert noble gas.

6. The method of claim 1 wherein introducing the semiconductor precursor and hydrogen includes supplying a nitrogen source gas, selected from a group consisting of $N_2$ and $NH_3$; and,
    wherein depositing the semiconductor nanoparticle embedded Si insulating film includes depositing SiOxNy, where (X+Y<2 and Y>0).

7. The method of claim 1 wherein annealing the semiconductor nanoparticle embedded Si insulating film includes using an annealing process selected from a group consisting of flash and laser annealing, using a heat source having a radiation wavelength selected from a group consisting of about 150 to 600 nm and 9 to 11 micrometers.

8. The method of claim 1 wherein using the HDPECVD process includes using a plasma concentration of greater than $1 \times 10^{11}$ $cm^{-3}$, with an electron temperature of less than 10 eV.

9. The method of claim 1 wherein depositing the semiconductor nanoparticle embedded Si insulating film includes depositing semiconductor nanoparticles selected from a group consisting of Si and Ge.

10. The method of claim 1 wherein introducing the semiconductor precursor and hydrogen includes supplying a precursor selected from a group consisting of $Si_nH2_{n+2}$ and $Ge_nH_{2n+2}$, where n varies from 1 to 4, $SiH_xR_{4-x}$ where R is selected from a first group consisting of Cl, Br, and I, and where x varies from 0 to 3, and $GeH_xR_{4-x}$ where R is selected from the first group, and x varies from 0 to 3.

11. The method of claim 1 wherein using the HDPECVD process includes using an inductively coupled plasma (ICP) source.

12. The method of claim 1 wherein forming the annealed semiconductor nanoparticle embedded Si insulating film includes forming a film selected from a group consisting of a non-stoichiometric $SiO_XN_Y$ thin-film, where (X+Y<2 and Y>0), and $SiC_X$, where X<1, and SiOx, where X<2.

13. The method of claim 1 wherein using the HDPECVD process includes heating an underlying substrate to a temperature of less than about 400° C.

14. The method of claim 1 wherein annealing the semiconductor nanoparticle embedded Si insulating film includes:
    heating an underlying substrate to a temperature of greater than about 400° C.;
    heating for a time duration in the range of about 10 to 300 minutes;
    heating in an atmosphere selected from a group consisting of oxygen and hydrogen, oxygen, hydrogen, and, inert gases; and,
    wherein forming the annealed semiconductor nanoparticle embedded Si insulating film includes modifying the size of the semiconductor nanoparticles in the Si insulating film in response to the annealing.

15. The method of claim 1 wherein providing a bottom electrode includes providing a bottom electrode on, a temperature-sensitive substrate selected from a group consisting of glass, metalized substrates, and plastic;
    wherein annealing the semiconductor nanoparticle embedded Si insulating film includes annealing at a temperature of less than 650° C.

16. The method of claim 1 wherein forming an annealed semiconductor nanoparticle embedded Si insulating film includes forming an annealed semiconductor nanoparticle embedded Si insulating film selected from a group consisting of intrinsic and doped semiconductor nanoparticle embedded Si insulating films.

17. The method of claim 16 wherein forming an annealed semiconductor nanoparticle embedded Si insulating film with dopant includes:
   forming an annealed semiconductor nanoparticle embedded Si insulating film with a dopant selected from a group consisting of Type 3, Type 4, Type 5, and rare earth elements; and,
   in response to doping, forming an annealed semiconductor nanoparticle embedded Si insulating film exhibiting optical absorption characteristics in a range of frequencies from deep ultraviolet (UV) to far infrared (IR).

18. The method of claim 1 further comprising:
   performing a HD plasma treatment on the annealed semiconductor nanoparticle embedded Si insulating film in an $H_2$ atmosphere, using a substrate temperature of less than 400° C.; and,
   hydrogenating the annealed semiconductor nanoparticle embedded Si insulating film.

19. The method of claim 18 wherein hydrogenating the annealed semiconductor nanoparticle embedded Si insulating film using the HD plasma process includes:
   supplying power to a top electrode at a frequency in the range of 13.56 to 300 MHz, and a power density of up to 10 W/cm$^2$;
   supplying power to a bottom electrode at a frequency in the range of 50 kilohertz to 13.56 MHz, and a power density of up to 3 W/cm$^2$;
   using an atmosphere pressure in the range of 1 to 500 mTorr; and,
   supplying an atmosphere selected from a group consisting of $H_2$ and an inert gas, and $H_2$.

20. The method of claim 1 wherein depositing the semiconductor nanoparticle embedded Si insulating film including depositing a semiconductor nanoparticle embedded Si insulating films with a Si nanoparticle distribution that varies with respect to the film thickness with a function selected from a group consisting of graded and stepped.

* * * * *

UNITED STATES PATENT AND TRADEMARK OFFICE
CERTIFICATE OF CORRECTION

PATENT NO. : 8,349,745 B2
APPLICATION NO. : 12/267698
DATED : January 8, 2013
INVENTOR(S) : Pooran Joshi et al.

It is certified that error appears in the above-identified patent and that said Letters Patent is hereby corrected as shown below:

In the Specification:
In column 7, Table 1, line 8 of Table 1: "0-150" has been incorrectly printed as "0-1.50".

In the Claims:
In column 12, claim 15, line 59: a "," has been incorrectly inserted between the word "on" and the word "a" (second occurrence). Claim 15 should read as follows:

15. The method of claim 1 wherein providing a bottom electrode includes providing a bottom electrode on a temperature-sensitive substrate selected from a group consisting of glass, metalized substrates, and plastic;
    wherein annealing the semiconductor nanoparticle embedded Si insulating film includes annealing at a temperature of less than 650° C.

Signed and Sealed this
Thirteenth Day of August, 2013

Teresa Stanek Rea
*Acting Director of the United States Patent and Trademark Office*